(12) United States Patent
Chen et al.

(10) Patent No.: US 7,495,736 B2
(45) Date of Patent: Feb. 24, 2009

(54) PIXEL ARRAY WITH FLEXIBLE CIRCUIT LAYOUT HAVING RESPECTIVE SCAN AND DATA LINE PROFILES WITH PREDETERMINED WAVE CONSTRUCTION SO AS TO EVENLY DISTRIBUTE ANY STRAIN ON THE RESPECTIVE SCAN AND DATA LINES TO WITHSTAND STRESS AND BE FLEXIBLE

(75) Inventors: Bo-Chu Chen, Hsinchu (TW); Huai-Yuan Tseng, Pingzhen (TW); Yung-Hui Yeh, Hsinchu (TW); Ching-Chieh Lin, Taipei (TW)

(73) Assignee: Industrial Technology Research Instituti, Hsinchu (TW)

( * ) Notice: Subject to any disclaimer, the term of this patent is extended or adjusted under 35 U.S.C. 154(b) by 428 days.

(21) Appl. No.: 11/214,875

(22) Filed: Aug. 31, 2005

(65) Prior Publication Data
US 2007/0019143 A1    Jan. 25, 2007

(30) Foreign Application Priority Data
Jul. 20, 2005    (TW) .............................. 94124447 A

(51) Int. Cl.
*G02F 1/1343* (2006.01)

(52) U.S. Cl. ...................................... 349/145; 349/146
(58) Field of Classification Search ................. 349/145, 349/146
See application file for complete search history.

(56) References Cited

U.S. PATENT DOCUMENTS 6,104,465 A * 8/2000 Na et al. ...................... 349/152

FOREIGN PATENT DOCUMENTS

JP           10153791 A  *  6/1998

* cited by examiner

*Primary Examiner*—David Nelms
*Assistant Examiner*—John Heyman
(74) *Attorney, Agent, or Firm*—WPAT. P.C.; Justin King

(57) ABSTRACT

A pixel array with flexible circuit layout is disclosed, which comprises: a substrate, having a first surface; a plurality of scan lines; and a plurality of data lines; wherein the plural scan lines are disposed on the first surface while each has a profile defined by a non-linear first function, and the plural data lines are disposed on the first surface while each has a profile defined by a non-linear second function. When the pixel array is adapted for a flexible display and the display is being bended, the flexible circuit layout of the pixel array of the invention can effectively reduce the risk of the snapping of the conductive wires used in the pixel array so that the flexibility and reliability of the flexible display are enhanced.

15 Claims, 5 Drawing Sheets

PIXEL ARRAY WITH FLEXIBLE CIRCUIT LAYOUT HAVING RESPECTIVE SCAN AND DATA LINE PROFILES WITH PREDETERMINED WAVE CONSTRUCTION SO AS TO EVENLY DISTRIBUTE ANY STRAIN ON THE RESPECTIVE SCAN AND DATA LINES TO WITHSTAND STRESS AND BE FLEXIBLE

FIELD OF THE INVENTION

The present invention relates to a pixel array, and more particularly, to a pixel array with flexible circuit layout, being adapted for a flexible display, which is capable of effectively reducing the risk of the snapping of the conductive wires used in the pixel array so as to enhance the flexibility and reliability of the flexible display.

BACKGROUND OF THE INVENTION

The marketplace continues to demand lighter and thinner portable electronic devices. As a result, portable electronic device manufactures require lighter, thinner flat panel displays (FPDs) which are preferred to be flexible or rollable. The attraction of a flexible screen is obvious. Product design, for example, can form a flexible screen in a curve, enabling unheard-of form factors for cell phones shaped like a lipstick or flat TVs that fit in your pocket. Nevertheless, it is important to have every semiconductor element used in the flexible FPD to be also flexible, which is especially true for the fragile conductive wires. That is, if the conductive wires used in a circuit layout of a pixel array flexible FPD is snapped by the stress/stain caused by the bending of the FPD, the FPD may not be able to function normally.

In a convention pixel array adapted for flexible displays, no matter it is a scan line or is a data line of the circuit layout of the pixel array, each is designed and laid out by using a single straight conductive wire. Please refer to FIG. 1, which is a schematic view showing the circuit layout of a conventional pixel array adapted for flexible displays. In the pixel array 100 of FIG. 1, both the scan lines 110 and data lines 120 are straight lines such that the conductive wires of the pixel array 100 are easy to snap when the pixel array 100 is subjected to an external force causing the stain of the conductive wires to exceed a tolerable limit. Most of the prior-art technology relating to the manufacturing of flexible displays are focused on either the improvement of semiconductor manufacturing process, or the materials used for making the flexible substrate and the micro-electronic components of the flexible displays. It is noted that there is never a technology trying to overcome the aforesaid snapping problem caused by unevenly distributed stress while bending by using a specifically designed pixel array with flexible circuit layout.

Therefore, it is in need of a pixel array with flexible circuit layout, being adapted for a flexible active/passive display, which is capable of effectively reducing the risk of the snapping of the conductive wires used in the pixel array so as to enhance the flexibility and reliability of the flexible display.

SUMMARY OF THE INVENTION

It is the primary object of the present invention to provide a pixel array with flexible circuit layout, being adapted for a flexible display, which is capable of effectively reducing the risk of the snapping of the conductive wires used in the pixel array so as to enhance the flexibility and reliability of the flexible display.

Another object of the invention is to provide a planar circuit layout for conductive wires, which can evenly distribute a strain to a plurality of sections formed by the conductive wires without the cost of increasing the complexity of the process of manufacturing the planar circuit layout.

To achieve the above objects, the present invention provides a pixel array with flexible circuit layout, being adapted for a flexible display, comprising: a substrate, having a first surface; a plurality of scan lines; and a plurality of data lines; wherein the plural scan lines are disposed on the first surface while each has a profile defined by a non-linear first function, and the plural data lines are disposed on the first surface while each has a profile defined by a non-linear second function. Moreover, the first function can generate a wave selected from the group consisting of a sine wave, a square wave and a triangle wave, and the second function can also generate a wave selected from the group consisting of a sine wave, a square wave and a triangle wave, and the substrate can be made of a material selected from the group consisting of glass, plastic, metal, flexible materials, and the scan lines and data lines can be made of metal.

The arrangement of the plural scan lines and the plural data lines forms an interlacing pattern on the pixel array in a way that a pixel is defined by any two neighboring scan lines and any two neighboring data lines. Each pixel of the pixel array comprises a thin film transistor connected respectively to the corresponding scan lines and data lines, which can be a PMOS transistor or a NMOS transistor.

In general, the pixel array uses a circuit layout formed by conductive wires, each having a profile defined by a sine wave, a square wave or a triangle wave, which is different than that of prior-art circuit and thus the stress acting on the conductive wires can be alleviated so as to enhance the flexibility and reliability of the conductive wires while being bended.

Other aspects and advantages of the present invention will become apparent from the following detailed description, taken in conjunction with the accompanying drawings, illustrating by way of example the principles of the present invention.

DESCRIPTION OF THE PREFERRED EMBODIMENT

For your esteemed members of reviewing committee to further understand and recognize the fulfilled functions and structural characteristics of the invention, several preferable embodiments cooperating with detailed description are presented as the follows.

Figure 1:
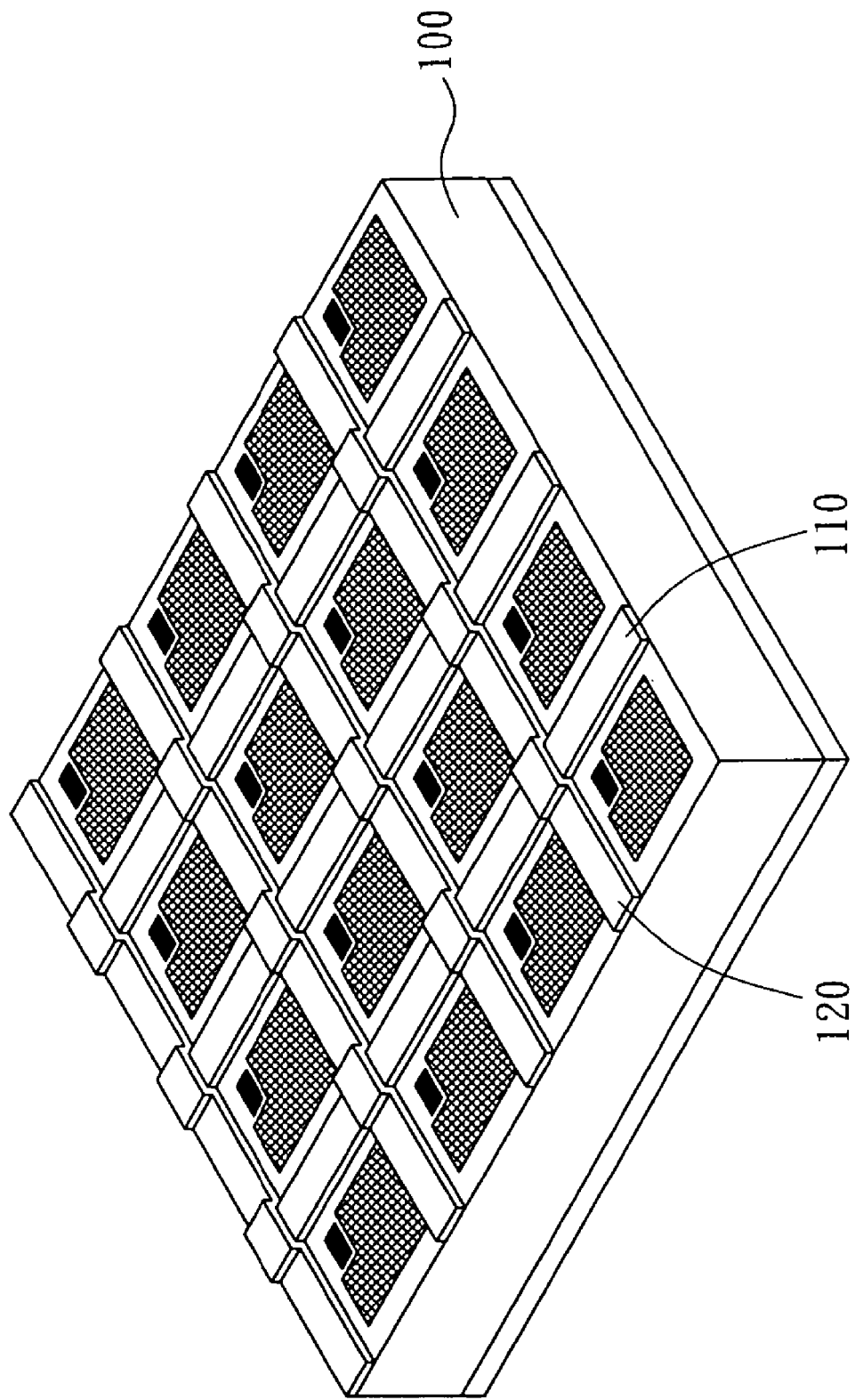
FIG. 1 is a schematic view showing the circuit layout of a conventional pixel array adapted for flexible displays.
Figure 2A:
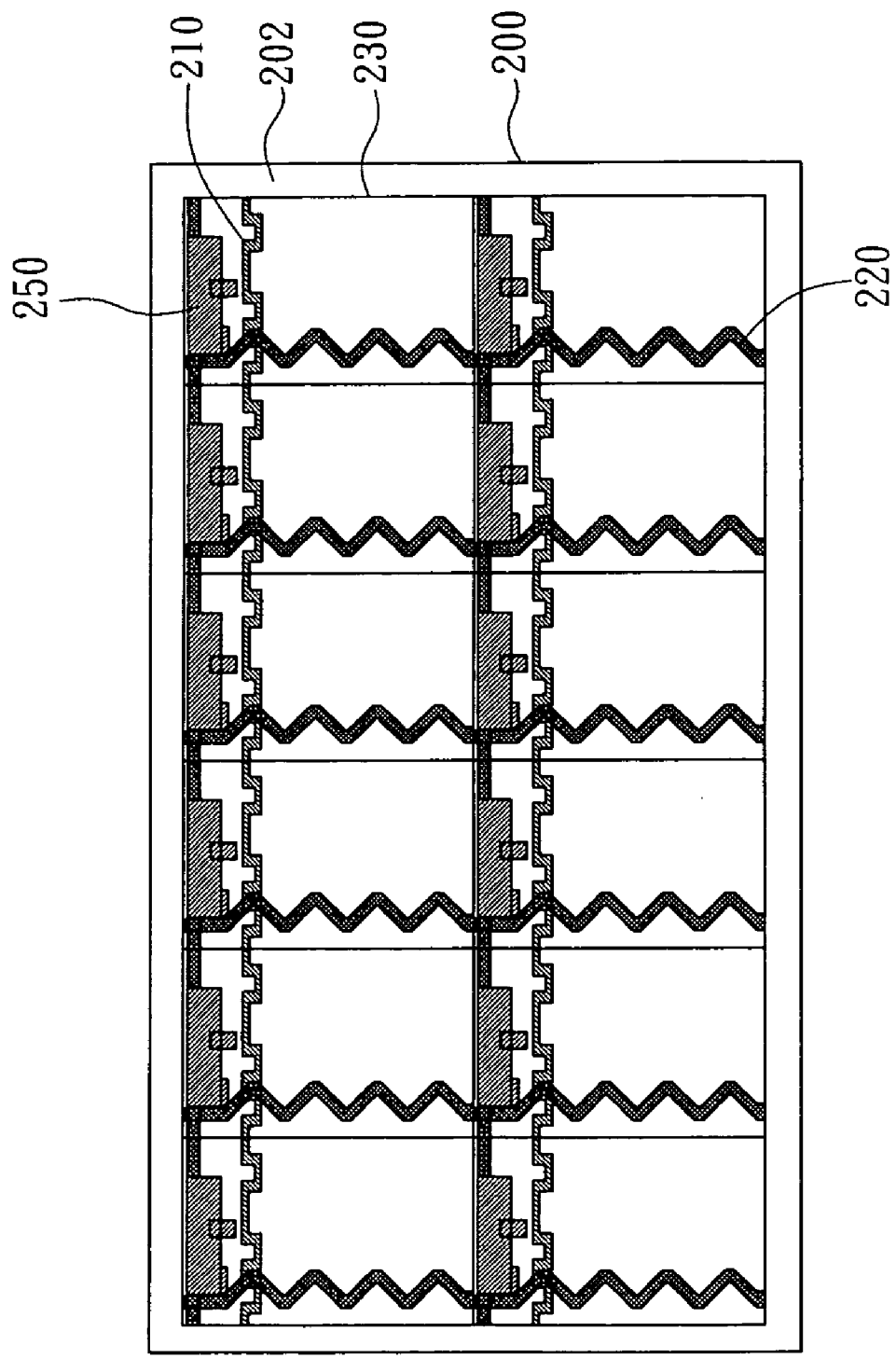
FIG. 2A is a schematic diagram showing a pixel array with flexible circuit layout according to a preferred embodiment of the invention.
Figure 2B:
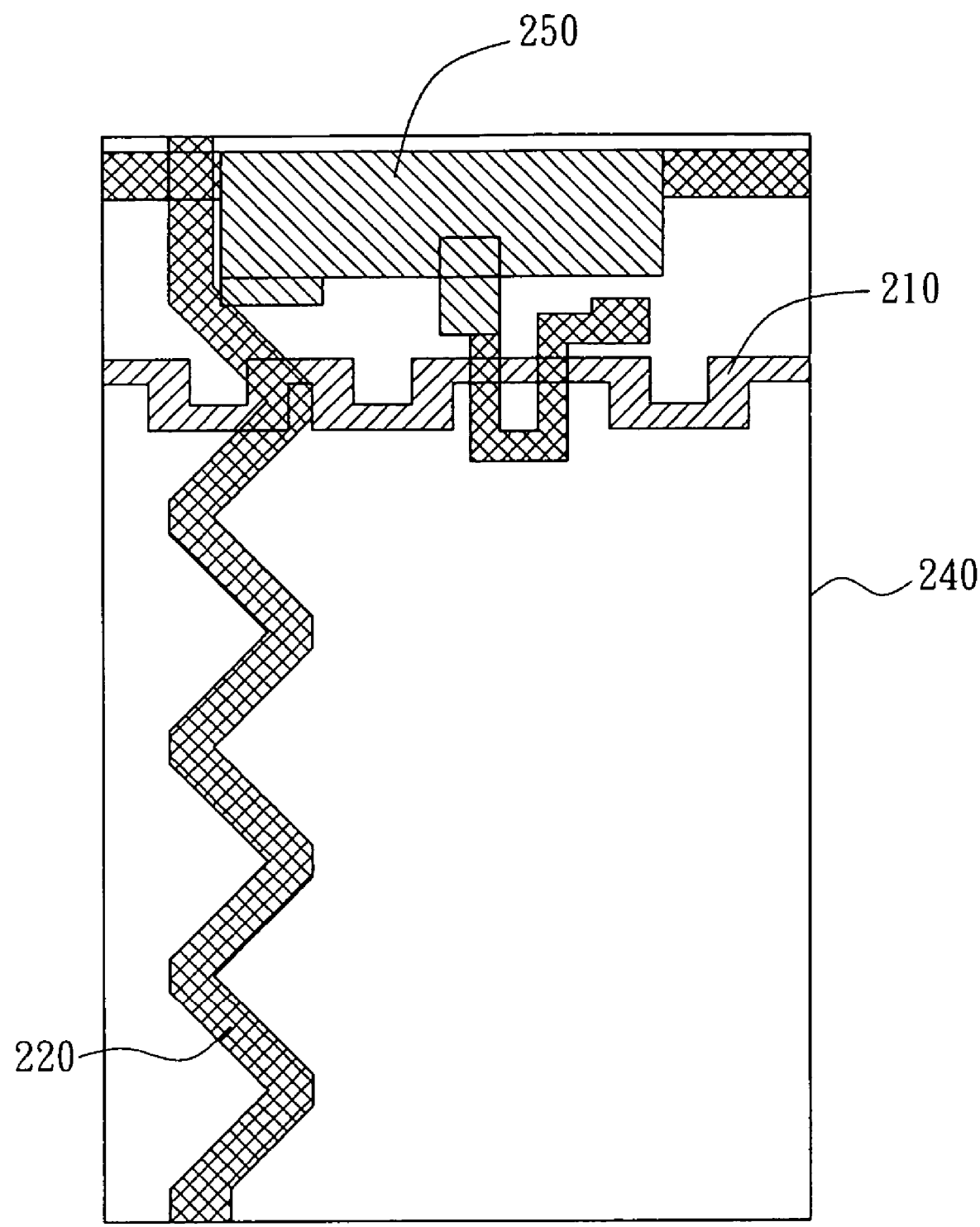
FIG. 2B a schematic diagram showing a pixel of FIG. 2A.

Please refer to FIG. 2A and FIG. 2B, which are schematic views of a pixel array with flexible circuit layout according to a preferred embodiment of the invention. The pixel array with flexible circuit layout, being adapted for a flexible display, comprising: a substrate 200, having a first surface 202; a plurality of scan lines 210; and a plurality of data lines 220; wherein the plural scan lines 210 are disposed on the first surface 202 while each has a profile defined by a non-linear first function of square wave, and the plural data lines 220 are disposed on the first surface 202 while each has a profile defined by a non-linear second function of triangle wave. In this preferred embodiment, the arrangement of the plural scan lines 210 and the plural data lines 220 forms an 6×2 interlacing pattern 230 on the pixel array in a way that a pixel 240 is defined by any two neighboring scan lines 210 and any two neighboring data lines 220. Each pixel 240 of the pixel array comprises a thin film transistor 250 connected respectively to the corresponding scan lines 210 and data lines 220. In general, the gate of the thin film transistor is connected to the horizontal scan line while the drain thereof is connected to the vertical data line.

Moreover, the substrate 200 can be made of a material selected from the group consisting of glass, plastic, metal, flexible materials, and the scan lines 210 and data lines 220 can be made of a metal, and the thin film transistor 250 can be a PMOS transistor or a NMOS transistor, which can be manufactured by any suitable process. It is noted that the selection of the type of the thin film transistor and the manufacturing process thereof will not affect the circuit layout of the pixel array, and the aforesaid circuit layer can also be applied in designing sensors or circuit units.

Figure 3:
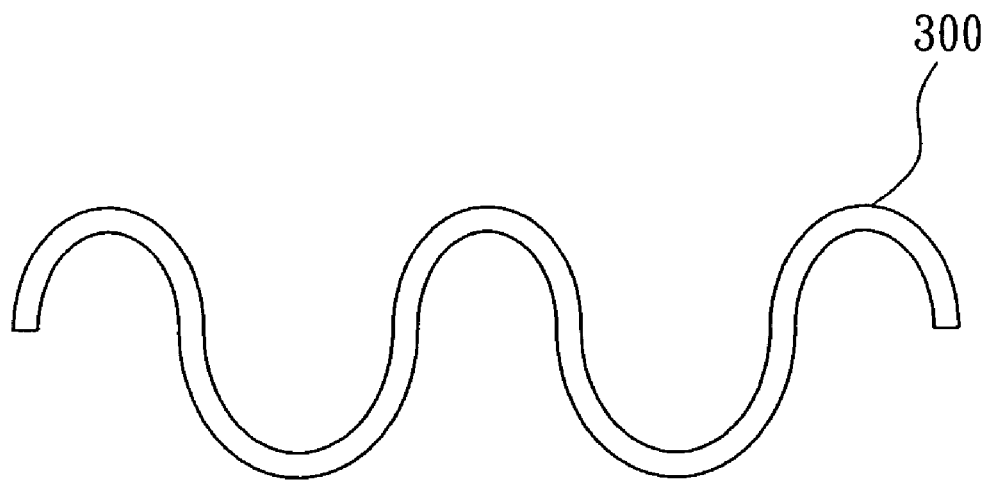
FIG. 3 is a schematic view of a conductive wire defined by a sine wave according to the present invention.

As seen in FIG. 3, each of the scan lines 210 or the data lines can be a sine-wave conductive wire 300. The sine-wave conductive wire 300 is not limited by a specific amplitude or frequency.

Figure 4:
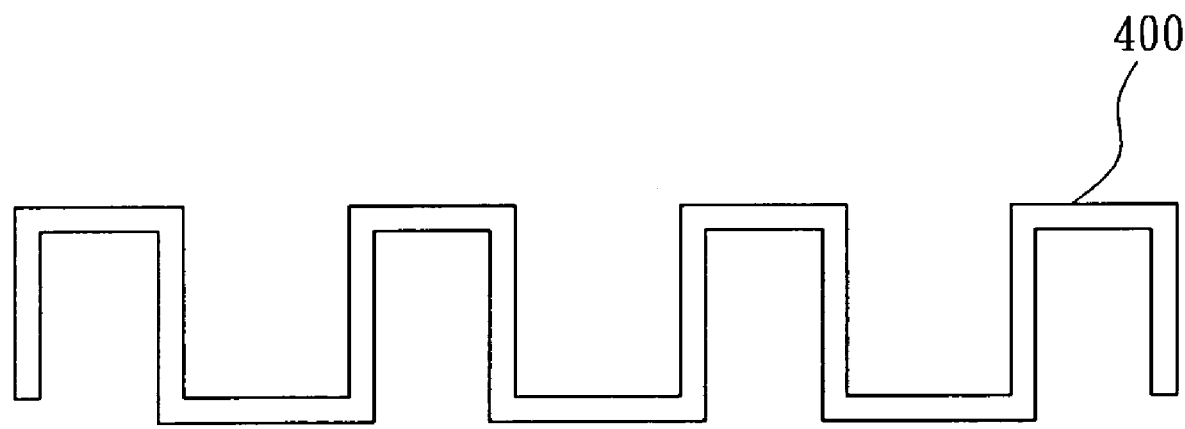
FIG. 4 is a schematic view of a conductive wire defined by a square wave according to the present invention.

As seen in FIG. 4, each of the scan lines 210 or the data lines can be a square-wave conductive wire 400. The square-wave conductive wire 400 is not limited by a specific amplitude or frequency.

Figure 5:
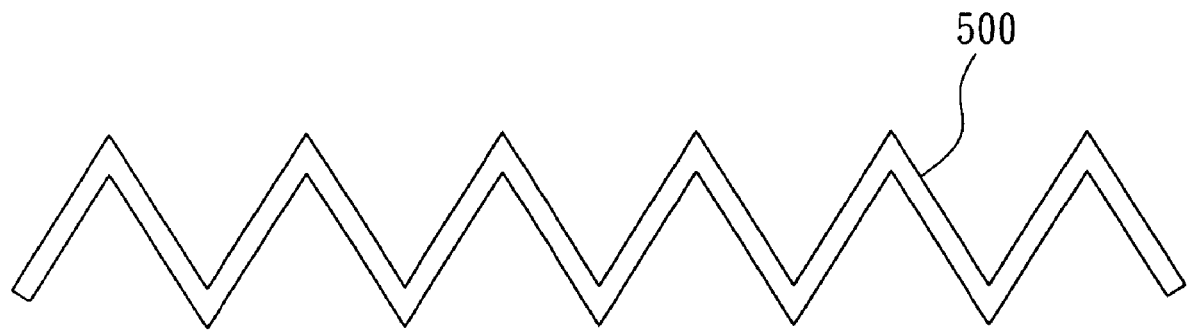
FIG. 5 is a schematic view of a conductive wire defined by a triangle wave according to the present invention.

As seen in FIG. 5, each of the scan lines 210 or the data lines can be a triangle-wave conductive wire 500. The triangle-wave conductive wire 500 is not limited by a specific amplitude or frequency.

Figure 6:
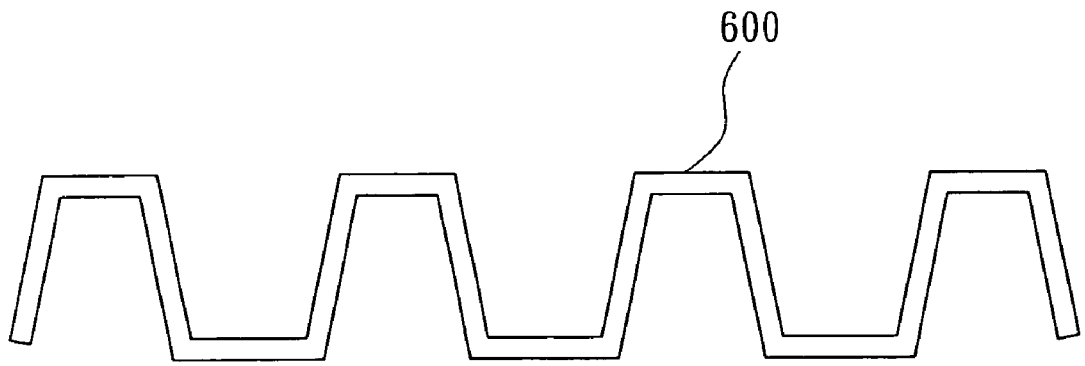
FIG. 6 is a schematic view of a conductive wire of trapezoid waveform according to the present invention.

Moreover, as seen in FIG. 6, each of the scan lines 210 or the data lines can be a conductive wire of trapezoid waveform 600. The conductive wire of trapezoid waveform 600 is not limited by a specific amplitude or frequency, and also the upper base as well as the lower base of the trapezoid can be any length.

It is noted that the profile of the scan line 210 or data line 220 can be a combination of any of the aforesaid waveforms, so that strain can be evenly distributed to a plurality of sections formed by the conductive wires and thus the conductive wires is enabled to stand a larger stress without snap.

To sum up, the pixel array uses a circuit layout formed by conductive wires, each having a profile defined by a sine wave, a square wave or a triangle wave, which is different than that of prior-art circuit and thus the stress acting on the conductive wires can be alleviated so as to enhance the flexibility and reliability of the conductive wires while being bended.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. A pixel array with flexible circuit layout, being adapted for a flexible display, comprising:
    a substrate, having a first surface;
    a plurality of scan lines, disposed on the first surface while each has a profile defined by a non-linear first function; and
    a plurality of data lines, disposed on the first surface while each has a profile defined by a non-linear second function,
    wherein said non-linear first and second profile functions of said respective scan and data lines are of a predetermined wave construction so as to evenly distribute any strain on said respective scan and data lines to thereby withstand stress and be flexible.

2. The pixel array of claim 1, wherein the profile of the first function is a sine wave.

3. The pixel array of claim 1, wherein the profile of the first function is a square wave.

4. The pixel array of claim 1, wherein the profile of the first function is a triangle wave.

5. The pixel array of claim 1, wherein the profile of the second function is a sine wave.

6. The pixel array of claim 1, wherein the profile of the second function is a square wave.

7. The pixel array of claim 1, wherein the profile of the second function is a triangle wave.

8. The pixel array of claim 1, wherein the substrate is made of a material selected from the group consisting of glass, plastic, metal, flexible materials.

9. The pixel array of claim 1, wherein the plural scan lines are made of a metal.

10. The pixel array of claim 1, wherein the plural data lines are made of a metal.

11. The pixel array of claim 1, wherein the arrangement of the plural scan lines and the plural data lines forms an interlacing pattern.

12. The pixel array of claim 11, wherein a pixel is defined by any two neighboring scan lines and any two neighboring data lines of the interlacing pattern.

13. The pixel array of claim 12, wherein each pixel defined in the interlacing pattern further comprises a thin film transistor connected respectively to the corresponding scan lines and data lines.

14. The pixel array of claim 13, wherein the thin film transistor is a PMOS transistor.

15. The pixel array of claim 13, wherein the thin film transistor is a NMOS transistor.

* * * * *

UNITED STATES PATENT AND TRADEMARK OFFICE
CERTIFICATE OF CORRECTION

PATENT NO. : 7,495,736 B2 Page 1 of 1
APPLICATION NO. : 11/214875
DATED : February 24, 2004
INVENTOR(S) : Bo-Chu Chen et al.

It is certified that error appears in the above-identified patent and that said Letters Patent is hereby corrected as shown below:

On the title page item [73], Assignee should read --Industrial Technology Research Institute.--.

Signed and Sealed this

Thirty-first Day of March, 2009

JOHN DOLL
*Acting Director of the United States Patent and Trademark Office*

UNITED STATES PATENT AND TRADEMARK OFFICE
CERTIFICATE OF CORRECTION

PATENT NO.        : 7,495,736 B2                                              Page 1 of 1
APPLICATION NO.   : 11/214875
DATED             : February 24, 2009
INVENTOR(S)       : Bo-Chu Chen et al.

It is certified that error appears in the above-identified patent and that said Letters Patent is hereby corrected as shown below:

On the title page item [73], Assignee should read --Industrial Technology Research Institute.--.

This certificate supersedes the Certificate of Correction issued March 31, 2009.

Signed and Sealed this

Twenty-first Day of April, 2009

JOHN DOLL
*Acting Director of the United States Patent and Trademark Office*